(12) United States Patent
Tang et al.

(10) Patent No.: US 7,792,222 B2
(45) Date of Patent: Sep. 7, 2010

(54) USING SOFT BIT DECISIONS TO IMPROVE DPSK DEMODULATION OF SPS DATA

(75) Inventors: Kai Tang, San Diego, CA (US); Douglas Neal Rowitch, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1005 days.

(21) Appl. No.: 11/431,803

(22) Filed: May 10, 2006

(65) Prior Publication Data
US 2006/0285612 A1 Dec. 21, 2006

Related U.S. Application Data

(60) Provisional application No. 60/679,703, filed on May 10, 2005, provisional application No. 60/728,078, filed on Oct. 19, 2005.

(51) Int. Cl.
*H03D 1/00* (2006.01)
*H03D 3/22* (2006.01)
(52) U.S. Cl. .................. 375/341; 375/330; 375/324; 329/304; 714/800
(58) Field of Classification Search .......... 375/330, 375/341, 324, 340; 329/304; 714/800
See application file for complete search history.

(56) References Cited

U.S. PATENT DOCUMENTS 5,671,156 A * 9/1997 Weerackody et al. .......... 714/52
5,764,690 A * 6/1998 Blanchard et al. ........... 375/147

OTHER PUBLICATIONS

International Search Report - PCT/US06/018373, International Search Authority - ISA/US - Aug. 20, 2007.
Written Opinion-PCT/US06/018373, International Search Authority-ISA/US-Aug. 20, 2007.

* cited by examiner

*Primary Examiner*—Temesghen Ghebretinsae
(74) *Attorney, Agent, or Firm*—Andrea L. Mays; Arnold J. Gum

(57) ABSTRACT

According to one embodiment, a demodulation system, such as DPSK in a SPS system can be used with soft decision information to correct bit errors. Soft decision information values are utilized to switch hard decision bits of the differentially decoded signal. A parity check can be used to determine if the toggling of the bit corrected the parity error.

58 Claims, 11 Drawing Sheets

USING SOFT BIT DECISIONS TO IMPROVE DPSK DEMODULATION OF SPS DATA

RELATED APPLICATIONS

This application claims priority to U.S. Provisional Application No. 60/679,703, filed on May 10, 2005, and U.S. Provisional Application No. 60/728,078, filed on Oct. 19, 2005.

BACKGROUND

1. Field

One embodiment relates generally to the field of signal demodulation. For example, one embodiment relates to demodulation of signals used in a satellite positioning system.

2. Relevant Background

When an encoded signal is received, the received signal often is severely attenuated due to noise sources and obstructions such as building structures and trees. As a result, it can be difficult to accurately decode the received signal. For example, a received signal from a Global Positioning System (GPS), Galileo and/or other satellite positioning or communication system, each referred to generally herein as a "Satellite Positioning System" (SPS), satellite vehicle can be so severely attenuated that the receiver inaccurately decodes a bit thus causing the received data to be useless. As a result, the receiver has to wait a significant amount of time—e.g., 30 seconds—for the next transmission of the positioning system information before repeating the demodulation function. Thus, the capability of a receiver to accurately demodulate a received signal is often a limiting factor in the performance of a receiver.

One type of demodulation system is known as a differential phase shift key (DPSK) demodulation. Even if the information is not differentially encoded at the transmitter, such as in a SPS system, one can use DPSK at the receiver. This type of demodulation system relies on the value of a previously received bit to determine the value of the present bit. Thus, once an error is introduced—e.g., a bit is incorrectly determined to be a "1" instead of a "0", the demodulator will produce a series of errors in the subsequent bit values, since the subsequent bit values are dependent upon the previous bit value that was in error. Thus, the resulting demodulated data will be in error. Previously, a demodulator would have had to obtain a re-transmission of the input data and had to repeat the demodulation. As a result, this caused the demodulation process to go more slowly than preferred or resulted in the data not passing at all—thus introducing a delay into the receiver or decreasing sensitivity. In a satellite positioning system, an error in demodulating almanac and ephemeris information constrains the sensitivity and time to first fix (TTFF) of a SPS receiver.

SUMMARY

According to one embodiment, a method of demodulating data can be implemented by providing a first input signal representative of a plurality of bits; performing differential phase shift key demodulation on the first input signal so as to obtain a first set of binary data and so as to obtain soft decision information from the input signal for each bit in a subset of the first set of binary data; determining a parity error for the first set of binary data after the performing differential phase shift key demodulation; determining a bit in the subset of the first set of binary data with the lowest absolute value of soft decision information; toggling the binary value of the bit with the lowest absolute value of soft decision information so as to form a second set of binary data; and checking for a parity error for the second set of binary data.

According to another embodiment, a method of demodulating data can be implemented by providing a first input signal representative of a plurality of bits; performing differential phase shift key demodulation on the first input signal so as to obtain a first set of binary data and so as to obtain soft decision information from the input signal for each bit in a subset of the first set of binary data; determining a parity error for the first set of binary data after the performing differential phase shift key demodulation; determining a first bit in the subset of the first set of binary data with the lowest absolute value of soft decision information; determining a second bit in the subset of the first set of binary data with the next lowest absolute value of soft decision information; testing the value of the soft decision information for the first bit against the value of the soft decision information for the second bit so as to determine whether the value of the soft decision information for the first bit is sufficiently different from the value of the soft decision information for the second bit, according to a predetermined standard; toggling the binary value of the bit with the lowest absolute value of soft decision information so as to form a second set of binary data if the value of the soft decision information for the first bit satisfies the predetermined standard.

In accordance with another embodiment, a method of demodulating data can be implemented by providing a first input signal comprising a word of transmitted data; processing the first input signal with a differential phase shift key demodulator so as to obtain from the first input signal a first set of first soft decision information values corresponding to bit index positions in the word of transmitted data; providing a second input signal; processing the second input signal with a differential phase shift key demodulator so as to obtain from the second input signal a second set of second soft decision information values corresponding to bit index positions in the word of transmitted data; performing a mathematical function on the first and second sets of corresponding first and second soft decision information values so as to obtain a third set of substitute soft decision information values corresponding to respective bit index positions in the word of transmitted data.

Similarly, the above methods can be accomplished in a receiver, an integrated circuit, or implemented via computer readable storage means in accordance with other embodiments.

DETAILED DESCRIPTION

Differential Phase Shift Key Demodulation Overview

Figure 1:
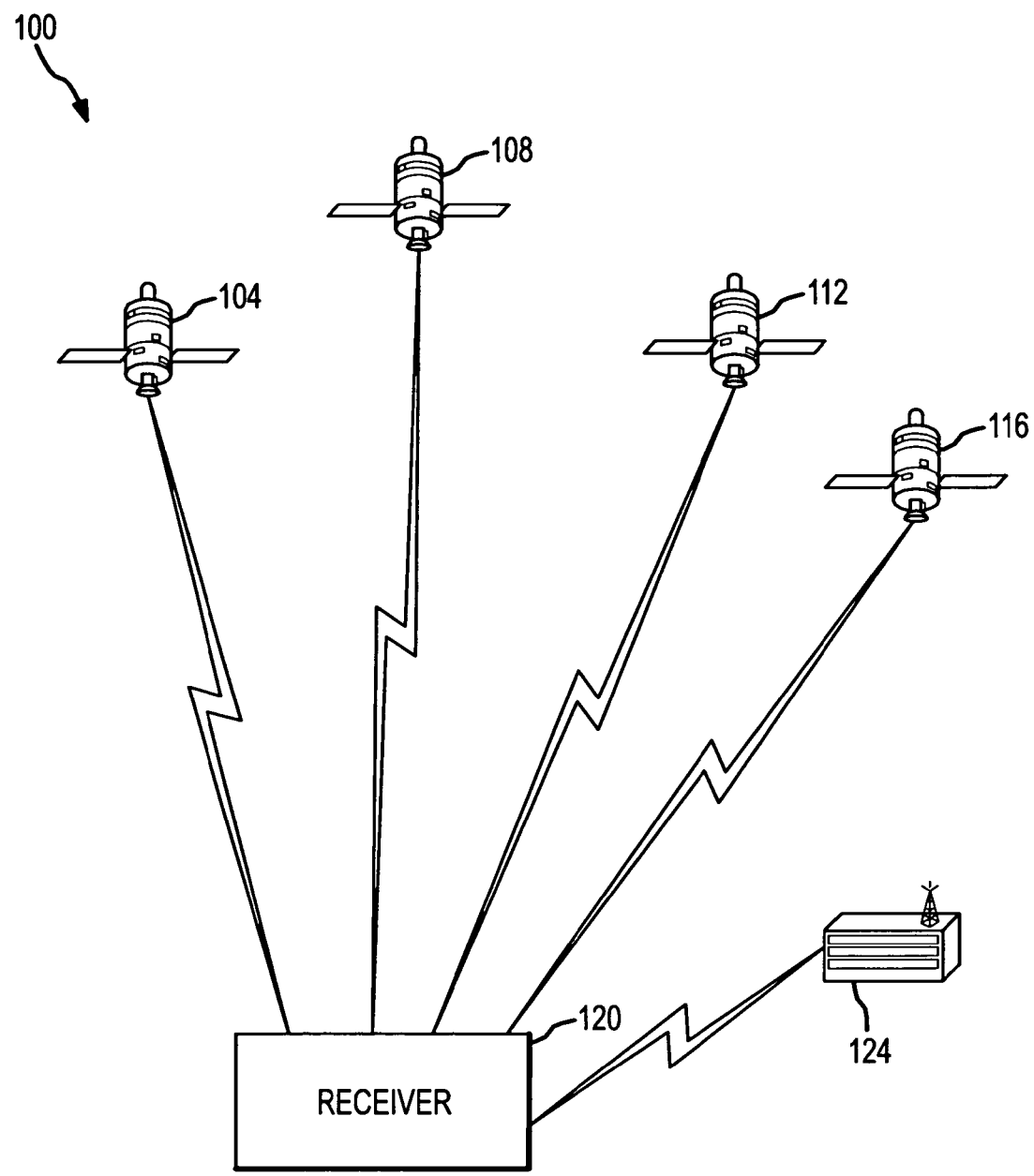
FIG. 1 illustrates a block diagram of a transmission system, according to one embodiment.

When a binary signal is transmitted from a transmitter to a receiver, such as that shown in the satellite system of FIG. 1, various types of modulation schemes can be used to modulate the binary signal onto a carrier signal. One such system is known as differential phase shift key demodulation or DPSK. This type of system is well known by those of ordinary skill in the art as a non-coherent form of phase shift keying which avoids the need for a coherent reference signal at the receiver. Non-coherent receivers are inexpensive to build since they do not require the reference signal circuitry and thus are useful in wireless communications.

At the receiver, the original sequence can be recovered by first detecting the differentially decoded binary sequence and then converting it back into the original binary sequence. In SPS systems, DPSK is not used at the transmitter. However, a DPSK demodulator can be used at the receiver.

Figure 2:
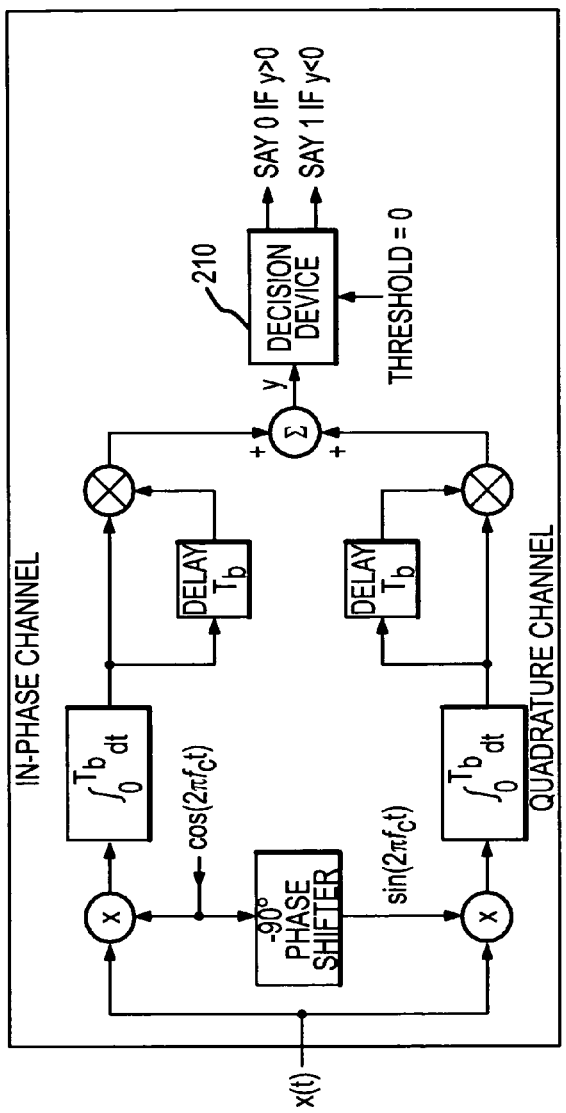
FIG. 2 illustrates a block diagram of a demodulation circuit in a receiver for recovering a differentially encoded bit stream according to one embodiment.

FIG. 2 illustrates an exemplary circuit for generating a "hard decision" in a DPSK demodulator. The receiver can measure the relative phase difference between the waveforms received during the two successive bit intervals. Ideally, if the phase difference of the two received signals is zero, then the recovered differentially decoded bit will be the symbol "0" in accordance with the transmission shift keying scheme. If the phase difference between the two waveforms received during the two successive bit intervals is π radians or 180 degrees, then the current bit has the symbol "1". The block "Delay $T_b$" represents the 1-bit delay or storage capability used by the receiver so as to use the previously received bit signal to decode the current bit signal. A threshold detector 210 is used to make the hard decision as to whether the differentially decoded bit is a 1 or a 0. This decision block is shown in FIG. 3 as "Hard Decision" block 310.

Figure 3:
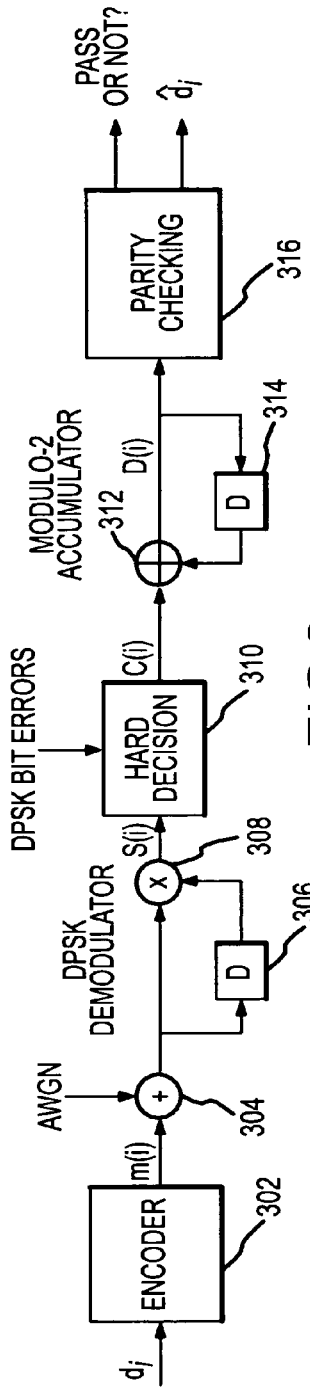
FIG. 3 illustrates a block diagram of a transmission system including noise in accordance with one embodiment.

FIG. 3 illustrates an error model for an exemplary DPSK demodulation scheme. In FIG. 3, a binary input sequence $d_i$ is input to an encoder at the transmitter. The encoder for example uses Hamming encoding and adds parity bits and transmits the signal across a transmission medium—such as a wireless transmission from a satellite to a ground based receiver. As a result of being transmitted across the transmission medium to the receiver, the signal becomes attenuated and additive white Gaussian noise is added to the signal. The DPSK receiver receives the signal and demodulates the signal. The demodulator initially determines an attenuated value that characterizes the phase difference between successive bit segment signals.

The demodulator makes a decision in the "Hard Decision" block to determine whether a signal represents a 1 or a 0 under the differentially decoding scheme—the decision is represented as C(i) in FIG. 3. This polarity value C(i) is then input to a modulo-2 accumulator along with the value of the previous bit (referenced as D in FIG. 3) to determine a binary value for the current bit. Thus, the modulo-2 accumulator produces a bit stream D(i) that represents the decoding of the originally encoded bit stream m(i). Assuming no errors have been introduced to the system, D(i) will equal m(i).

Table 1 below illustrates the an example of the DPSK demodulation process in accordance with FIG. 3 and assuming no bit errors occur in the decoded bit sequence.

TABLE 1

| Transmitted bits {m(i)} | 1 | 0 | 1 | 1 | 0 | 0 | 1 | 0 |
| --- | --- | --- | --- | --- | --- | --- | --- | --- |
| Transmitted phase (radians) | π | 0 | π | π | 0 | 0 | π | 0 |
| Differentially decoded bits {C(i)} |   | 1 | 1 | 0 | 1 | 0 | 1 | 1 |
| Restored bit sequence {D(i)} | 1 | 0 | 1 | 1 | 0 | 0 | 1 | 0 |

Satellite Positioning System Overview

Differential Phase Shift Key (DPSK) demodulators can be useful in satellite positioning systems (SPS) as well as other transmission systems. A SPS system is a type of system utilized to provide highly accurate position information to receivers on the earth. Such receivers can be located at base stations, in automobiles, in ships, in airplanes, and in consumer mobile devices such as cellular telephones, wireless modems, wireless modules, personal digital assistants (PDA), laptops with wireless access, and so on, referred to generally herein as mobile stations. For example, FIG. 1 illustrates an example of a SPS system 100 in which satellites 104, 108, 112, and 116 transmit SPS signals to receiver 120. In addition to receiving the SPS signals, the receiver can also be configured to receive other wireless communication signals from a transmitter 124. Thus, for example, a cellular telephone can be configured with the capability to transmit its SPS coordinates as part of a call—such as in a "911" call. The SPS satellites, receiver, and cellular transmitter can be configured according to the block diagram of FIG. 4.

One example of a satellite positioning system is that administered by the United States that includes approximately 24 satellite vehicles positioned in predetermined orbits about the Earth. While these satellite vehicles have substantially predetermined orbits, those orbits can vary to some degree. Thus, the satellite vehicles transmit data to the receivers to allow the receiver to know changes in the satellite vehicle's location. This data that is transmitted is referred to as almanac and ephemeris data.

The almanac data is used to identify the approximate locations of all of the satellite vehicles being used in the system. Thus, in the example where 24 satellite vehicles or SV's are being used, the almanac data would include information that indicates to the receiver where all 24 satellites are roughly orbiting. This almanac data is the same for all 24 satellites. The ephemeris data is specific to each particular SV. It identifies how that specific SV's position differs from the predetermined orbit. Thus, each SV transmits ephemeris data specific to itself. It is important for the receiver to be able to track the exact location of the SV since this position is used to determine the receiver's position.

The receiver in a SPS system uses transmissions from 3 or more satellites to determine the receiver's position. Essentially, each satellite transmits a signal that corresponds to a reference signal used by the receiver. Reception of the satellite transmission can be compared to the reference signal at the receiver to determine the time delay in the received signal relative to the reference signal. The time delay is a function of the actual distance between the satellite vehicle and the receiver. Thus, if the receiver knows the exact location of a satellite vehicle it can determine the distance from the satellite vehicle to the receiver. When three or more satellites transmit their signals to a receiver, the receiver can pinpoint its location on earth (or in the air above Earth in the case of an airplane). The more satellites that are involved in the determination allows more exact results. However, the determination is based on the almanac data and ephemeris data described above—since that data identifies where each satellite is located.

Figure 5:
FIG. 5 illustrates an example of the formatting of satellite positioning data in accordance with one embodiment.
Figure 5:
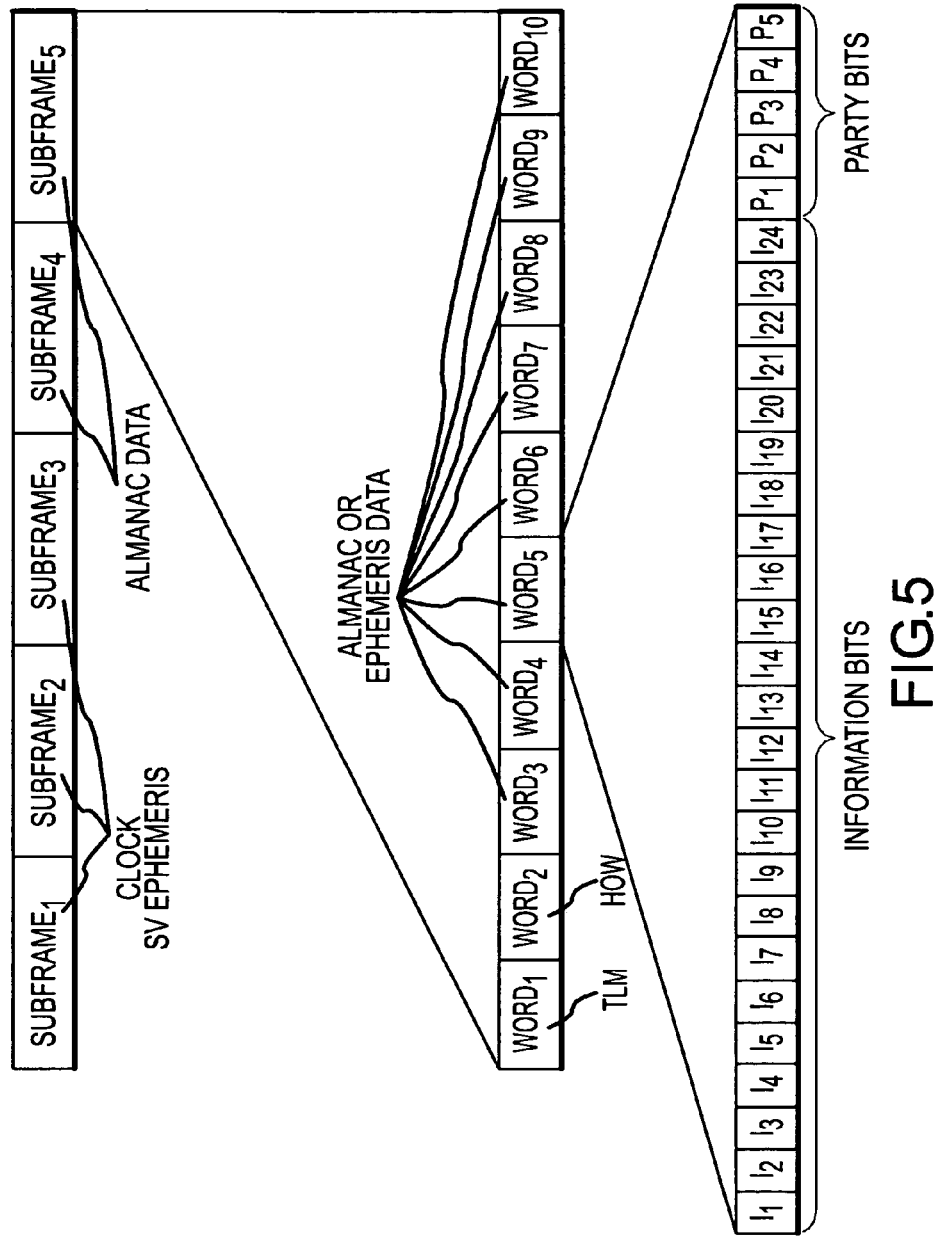

FIG. 5 illustrates an example of how SPS data can be formatted. FIG. 5 shows a series of 25 frames of data. Each frame of data is shown having 5 subframes. Furthermore, each subframe is shown as having 10 words wherein each word is shown having 24 information bits and 6 parity bits. According to one embodiment, the data bits are transmitted at a rate of 50 bits/sec or 20 msec per bit. Therefore, each 30 bit word is transmitted in 0.6 seconds and each subframe is transmitted in 6 seconds. Similarly, in this example, it would take 30 seconds to transmit an entire frame of data. When a 30 bit word is used comprising 24 information bits and 6 parity bits, the word can be encoded using an extended Hamming (32, 26) block code. The input of the encoder would use the 24 information bits and last two parity bits from the previous word.

In the SPS system administered by the United States, the first three subframes contain the clock and satellite vehicle ephemeris data. The last two subframes contain the almanac data. It takes 25 frames to convey the almanac data for all 24 satellite vehicles in the SPS system administered by the United States for example—thus 12.5 minutes. In contrast, the ephemeris data is repeated every frame, i.e., every 30 seconds. Thus, the ability to accurately receive and demodulate the ephemeris data will allow a receiver to prevent the 30 second delay that is introduced when ephemeris data cannot be decoded correctly. Consequently, performance of the receiver will be improved.

Use of Soft Decision Information

As noted earlier, under real world conditions the signals received by the receiver from the transmitter will often be highly attenuated or will have incurred a phase shift. For example, two normalized signals received from the transmitter can be referenced as complex numbers as $s_1$ and $s_2$ wherein $$s_1 = e^{j\Phi_1}$$

and wherein $$s_2 = e^{j\Phi_2}.$$

Thus, the phase difference between the two signals s1 and s2 can be measured by multiplying s2 and the conjugate of s1. This produces a complex number having a magnitude between 1 and −1. For example, if $\Phi_2 = \Phi_1$ then the magnitude is 1. If $\Phi_2 = \Phi_1 + \Pi$, then the magnitude is −1. In a non-ideal environment, however, the magnitude will vary between 1 and −1.

FIG. 3 shows a hard decision block 310. The hard decision block determines whether the value of the magnitude is closer to 1 or −1 and then outputs a 0 or 1 bit accordingly. The 0 or 1 value is then forwarded to modulo-2 accumulator 312 which also receives the previously decoded bit D shown in block 314. The output of the modulo-2 accumulator is the bit D(i). While one of ordinary skill in the art can appreciate that a variety of schemes can be used by the receiver to decode the received signal, the input to the hard decision block of the receiver is understood in the industry to be soft decision information.

Thus, the magnitude of the soft decision information that is input into the hard decision block could be very close to 0, i.e. a very small positive value or a very small negative value. When the value is close to 0, it could very well likely be in error. For example, due to noise and attenuation or occasional frequency jump by the receiver the soft decision bit information might indicate a very small positive number when in fact it should actually indicate a negative number. Similarly, the soft decision bit information might indicate a very small negative number when in fact it should actually indicate a positive value.

As a result of these errors in the value of the soft decision information, the hard decision block 310 in FIG. 3 will produce an erroneous bit value that is input into the Modulo-2 Accumulator 312. Consequently, this error will produce an erroneous value for the decoded bit string. Furthermore, the erroneous value will be used as D in block 314 to compute the next value in the bit string and the error will be propagated through the remaining values of the bit string. If a second error occurs in the soft decision information, that error will correct the propagation of errors. However, the previous data will still be corrupted.

FIG. 3 shows a parity checking block 316. The parity check can be utilized to determine if there is a detectable error in the output of the demodulator. For example, if a Hamming code is used with six parity bits, most errors out of the demodulator will be detected. Assuming that a single bit error is encountered, prior systems would have recognized the existence of the error but would not have been able to correct it. According to one embodiment, the soft decision information can now be used to correct such an error.

Figure 6:
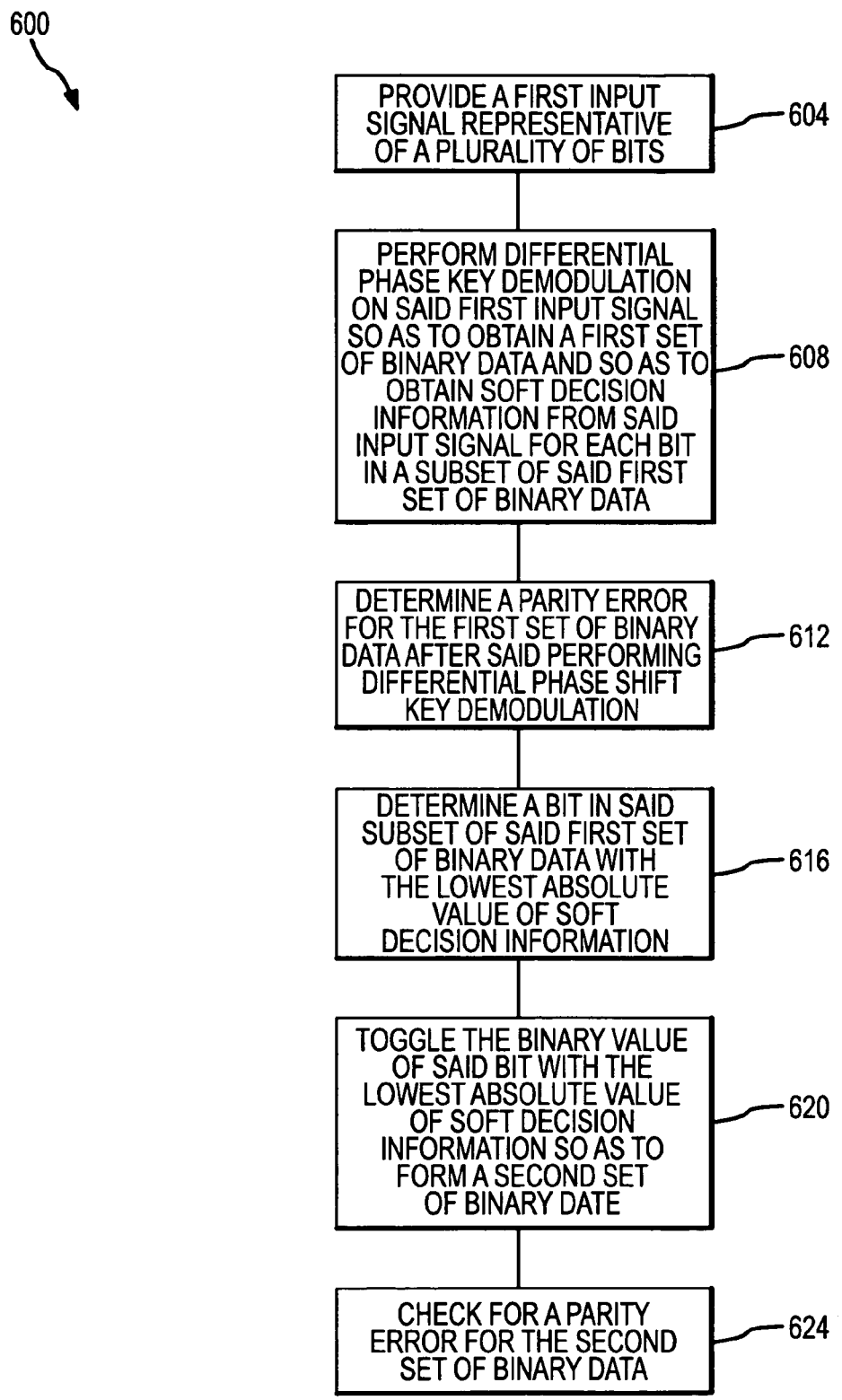
FIG. 6 illustrates a flowchart demonstrating a method of reducing bit errors in a demodulation system, according to one embodiment.

Generally speaking, if a parity error is detected for a set of data, the soft decision information can provide some probability of which bit is in error. For example, if the magnitude of the soft decision information is very close to "0" when a "1" or a "−1" value is expected, the bit associated with that soft decision information will be suspect. One can toggle the bit and repeat the parity check on the output binary string of data from the hard decision block to see if the toggling of the bit corrected the error. For example, FIG. 6 illustrates a flowchart 600 demonstrating a method according to one embodiment. According to this flowchart, a first input signal representative of a plurality of bits is provided, as shown in block 604. Block 608 shows that differential phase shift key demodulation is performed on the first input signal so as to obtain a first set of binary data and so as to obtain soft decision information from the input signal for each bit in a subset of the first set of binary data. A parity error check can then be made, as shown in block 612 to determine if a parity error exists for the first set of binary data after the performance of the differential phase shift key demodulation.

Block 616 indicates that a determination is made as to which bit in the subset of the first set of data has the lowest absolute value of soft decision information. Thus, for example, if one bit is associated with a soft decision value magnitude of −0.3 and another bit is associated with a soft decision value having a magnitude of +0.2, the bit associated with the soft decision information having a magnitude of +0.2 would be lowest. Block 620 indicates that the binary value of the bit with the lowest absolute value of soft decision information is toggled so as to form a second set of binary data. Furthermore, block 624 illustrates that the second set of binary data can then be checked to determine if there is a parity error. If there is no parity error, then the error is considered corrected.

According to another embodiment, the bit associated with the next lowest absolute value of soft decision information can be toggled. Thus, if the first attempt to correct the parity error fails, the process can be repeated by toggling the differentially decoded bit associated with the next lowest absolute value of soft decision information —rather than toggling the differentially decoded bit associated with the lowest absolute value of soft decision information. After the toggling, the binary output string can be generated and the parity of the binary output string can then be checked. This embodiment may be useful, for example, in instances where two bits are associated with soft decision information values that are very close to one another—thus, either could be the likely source of the error.

Test Prior to Soft Decision Information Correction

Figure 7:
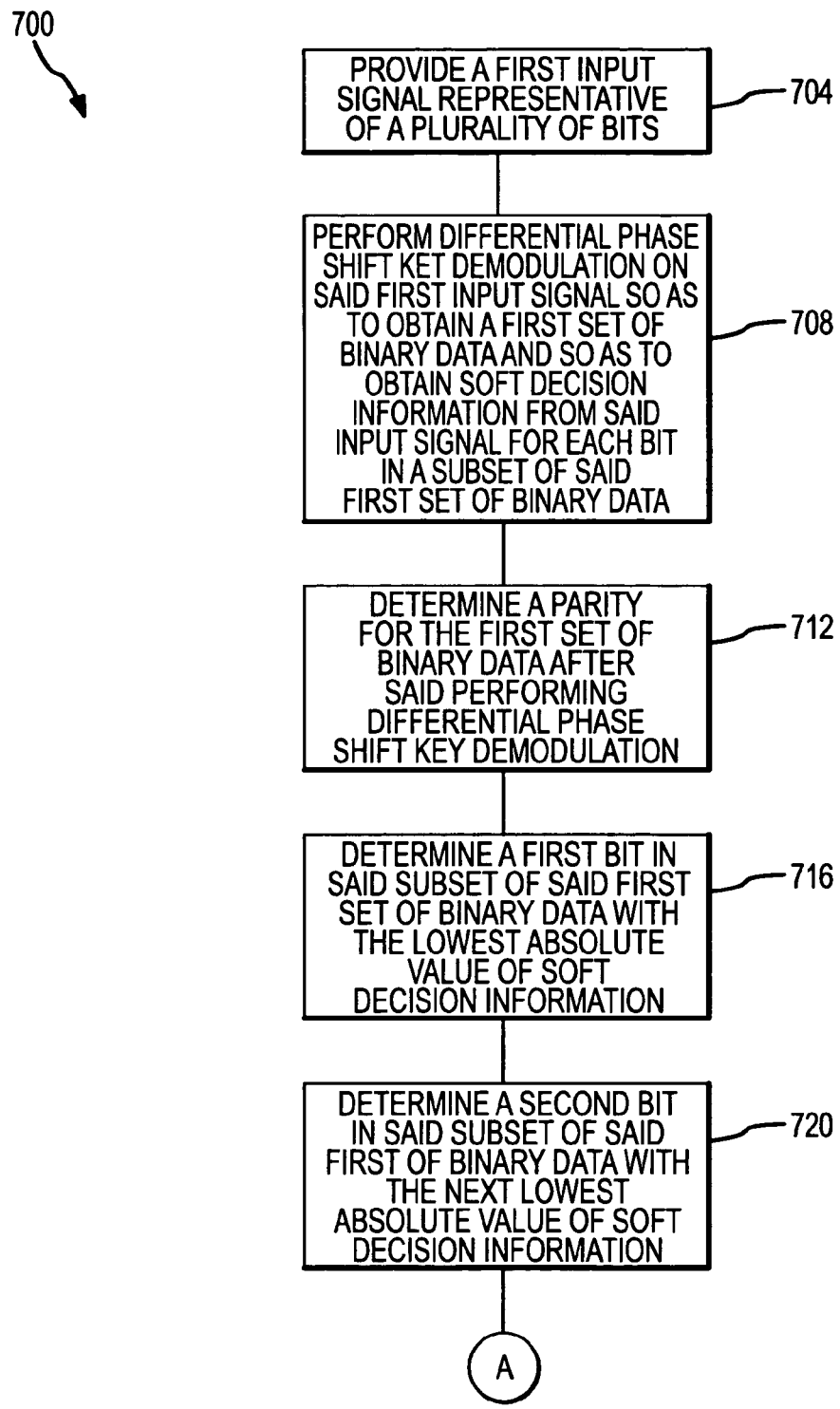
FIGS. 7 and 8 illustrate a flowchart demonstrating a method of utilizing soft decision information in a demodulation system, according to one embodiment.
Figure 8:
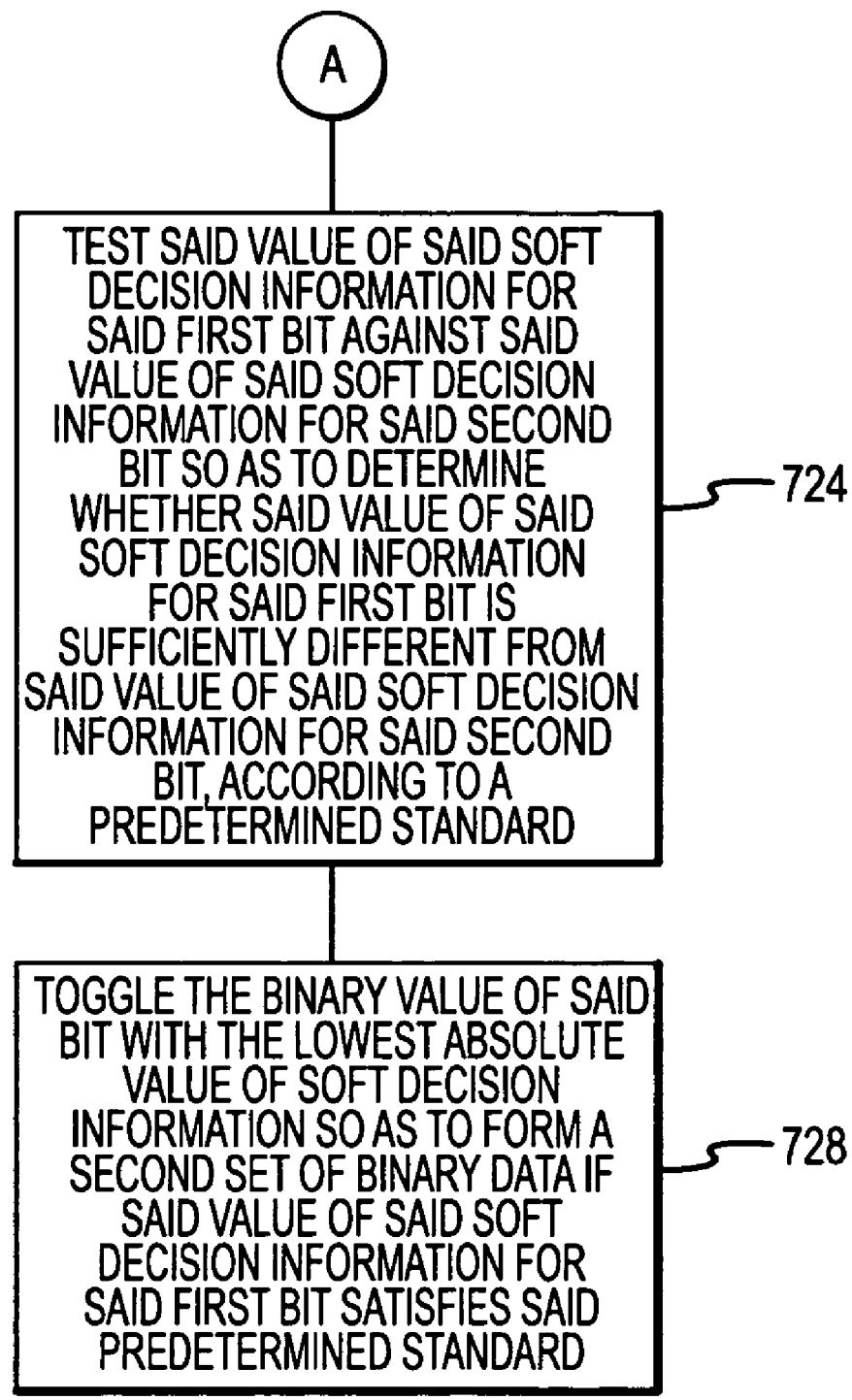

According to another embodiment, a test can be implemented prior to utilizing the soft decision information correction described above. Under some conditions, there will be multiple errors in a detected word of data. In some situations, the implementation of correcting one bit may produce a parity check that indicates no parity error—nevertheless, the decoded word may still be in error (given the multiple errors that exist in the detected word to begin with). Thus, an additional test can help to reduce the undetected word error rate (UWER) for the receiver. FIGS. 7 and 8 illustrate a flowchart demonstrating such a method according to one embodiment.

Namely, FIGS. 7 and 8 show a flowchart 700 in which block 704 provides a first input signal representative of a plurality of bits. In block 708, differential phase shift key demodulation is performed on the first input signal so as to obtain a first set of binary data and so as to obtain soft decision information from the input signal for each bit in a subset of the first set of binary data. In block 712, a check is made to determine whether there is a parity error for the first set of binary data output from the differential phase shift key demodulator. If a parity error exists, the absolute values of the soft decision information can be determined. In block 716 of flowchart 700, a determination is made of a first bit in the subset of the first set of binary data that is associated with the lowest absolute value of soft decision information. Furthermore, in block 720, a second bit associated with the second lowest absolute value of soft decision information is determined. In block 724, the value of the soft decision information for the first bit is tested against the value of the soft decision information for the second bit so as to determine whether the value of the soft decision information for the first bit is sufficiently different from the value of the soft decision information for the second bit. Furthermore, block 724 indicates that this test is made in accordance with a predetermined standard. In block 728, the binary value of the differentially decoded bit associated with the lowest absolute value of soft decision information is toggled so as to form a second set of binary data which is passed through the modulo-2 accumulator shown in FIG. 2 to produce an output binary string that can be parity checked. This toggling is implemented if the soft decision information for the first bit satisfies the predetermined condition. Alternatively, the toggling is not implemented if the predetermined condition is not satisfied.

For example, one may choose to test whether the magnitude of the soft information for bit #1 is twice the magnitude for bit #3 before toggling bit #3 to attempt to correct the parity error. Such a test gives the designer a level of comfort that bit #3 is actually the bit that is in error and that toggling the bit will not produce a word that passes the polarity test yet is still incorrect—which would increase the undetected word error rate (UWER) for the receiver. If the predetermined test is not satisfied, the receiver can input a new signal which in the case of a SPS signal would be a new frame of data that contains the ephemeris information. The process could then be repeated. This repetition prevents an increase in UWER which might result if the predetermined condition is not met.

Examples of tests that can be used are:

$$LowBit < \alpha * NextLowBit$$

wherein LowBit is the magnitude of the soft decision information that has the lowest soft decision magnitude relative in a set of soft decision values. Also, NextLowBit is the magnitude of the soft decision value having the next lowest magnitude in the set of soft decision values. Alpha ($\alpha$) is a predetermined multiplier, such as the integer 3—it need not necessarily be a constant value however, as it could be a function of another variable.

Another test that can be used is:

$$LowBit < \alpha * NextLowBit + \beta * (N0/2)$$

wherein $\beta$ is a predetermined multiplier and N0/2 is the variance of noise at the input to the DPSK demodulator. Typically, N0/2 is a fixed value due to the automatic gain control circuit.

Figure 9:
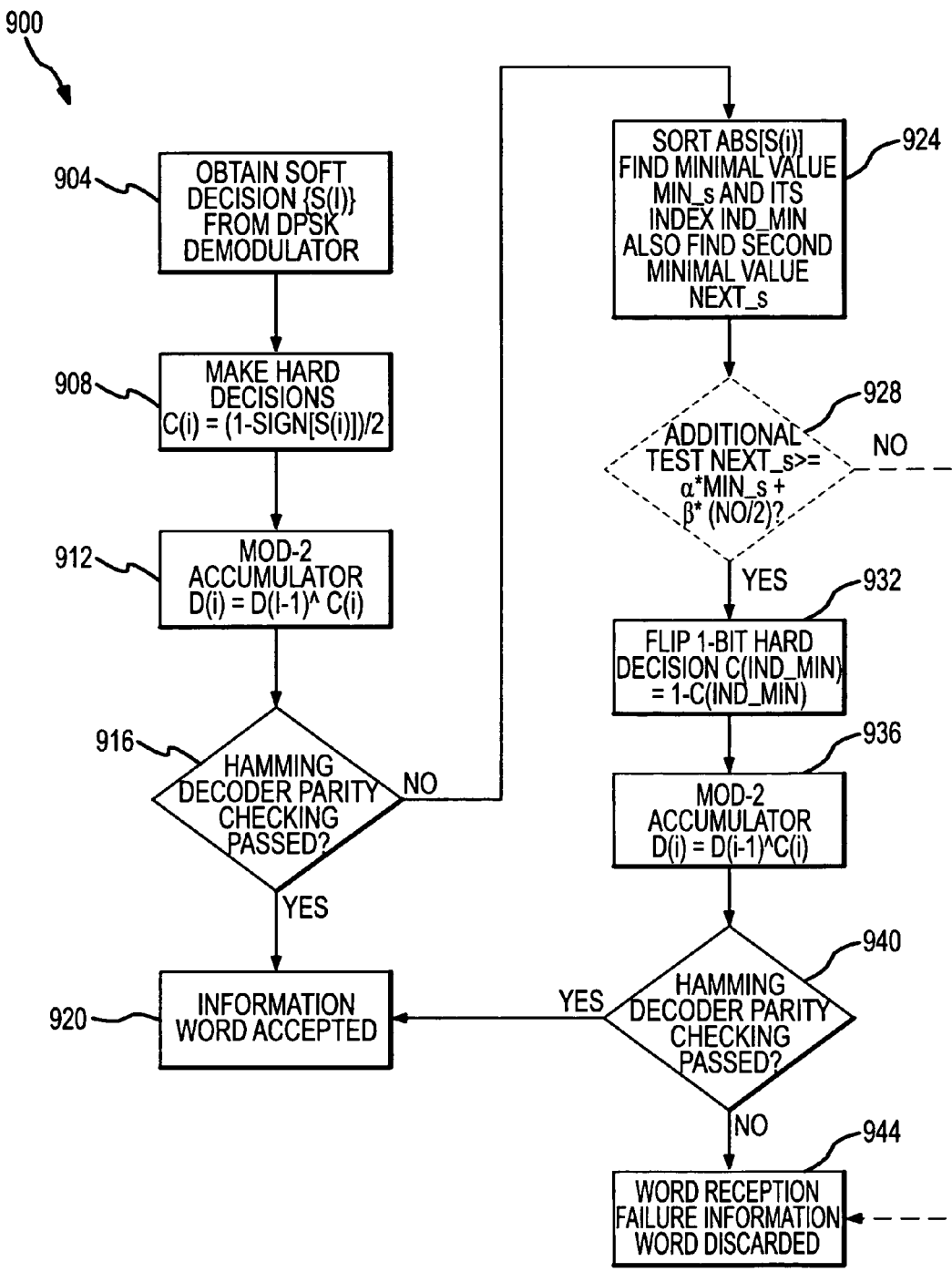
FIG. 9 illustrates a flowchart demonstrating a method of correcting hard decision errors in accordance with one embodiment.

FIG. 9 shows another example of a flowchart 900 that demonstrates these embodiments for utilizing soft decision information to correct demodulation results. In block 904, soft decision information {S(i)} is obtained. In block 908, hard decisions are made as indicated by the equation C(i)= (1-sign[S(i)])/2. In block 912, a modulo-2 accumulator is used to compute D(i), wherein D(i)=D(i-1)^C(i) (i.e., D(i-1) and C(i) are inputs to the modulo-2 accumulator and D(i) is output). If a Hamming code was initially used to encode the information, a parity check can be performed on the information word produced from the D(i) outputs, as shown by decision block 916. If the parity check passes, then block 920 shows that the information word is accepted.

If a parity error is determined in decision block 916 a sort can be performed of the magnitude of soft decision information as shown in block 924. The minimal value (min_s) and its index (ind_min) can also be determined. The index associates the soft decision information with a particular bit. Furthermore, the second minimal value (value_next_s) can be determined. Decision block 928 illustrates the option of using a test prior to toggling a bit. The test used in the example of block 928 is next_s>=α*min_s+β*(N0/2). This test would require that the next lowest magnitude of soft decision information be greater or equal to a factor of the lowest magnitude of soft decision information added to a factor of the variance of noise at the input to the demodulator. If the test is not satisfied, the word reception is considered a failure and the data can be discarded, as shown in block 944. If the test is satisfied, block 932 shows that the output of the hard decision associated with min_s is toggled (i.e., "flipped"). Once the bit value is flipped, the trailing bit stream can be recalculated with the mod-2 accumulator, wherein the output of the mod-2 accumulator is D(i)=D(i-1)^C(i). Once the new set of output bits is produced by the modulo-2 accumulator, the parity of the set of bits can be checked again. Thus, block 940 illustrates that a Hamming Decoder can be used, for example. If parity does pass, then the information word can be accepted, as shown by block 920. If parity does not pass, then word reception can be designated a failure and the information word can be discarded, as shown by block 944.

While the above examples refer to toggling a single bit, it would also be possible to toggle multiple bits. For example, if the soft decision information for two bits meet the predetermined standard, both bits could be toggled—rather than just one. In fact, any number of bits could be toggled if they met the predetermined standard.

Multiple Pass Use of Soft Decision Information

Figure 10:
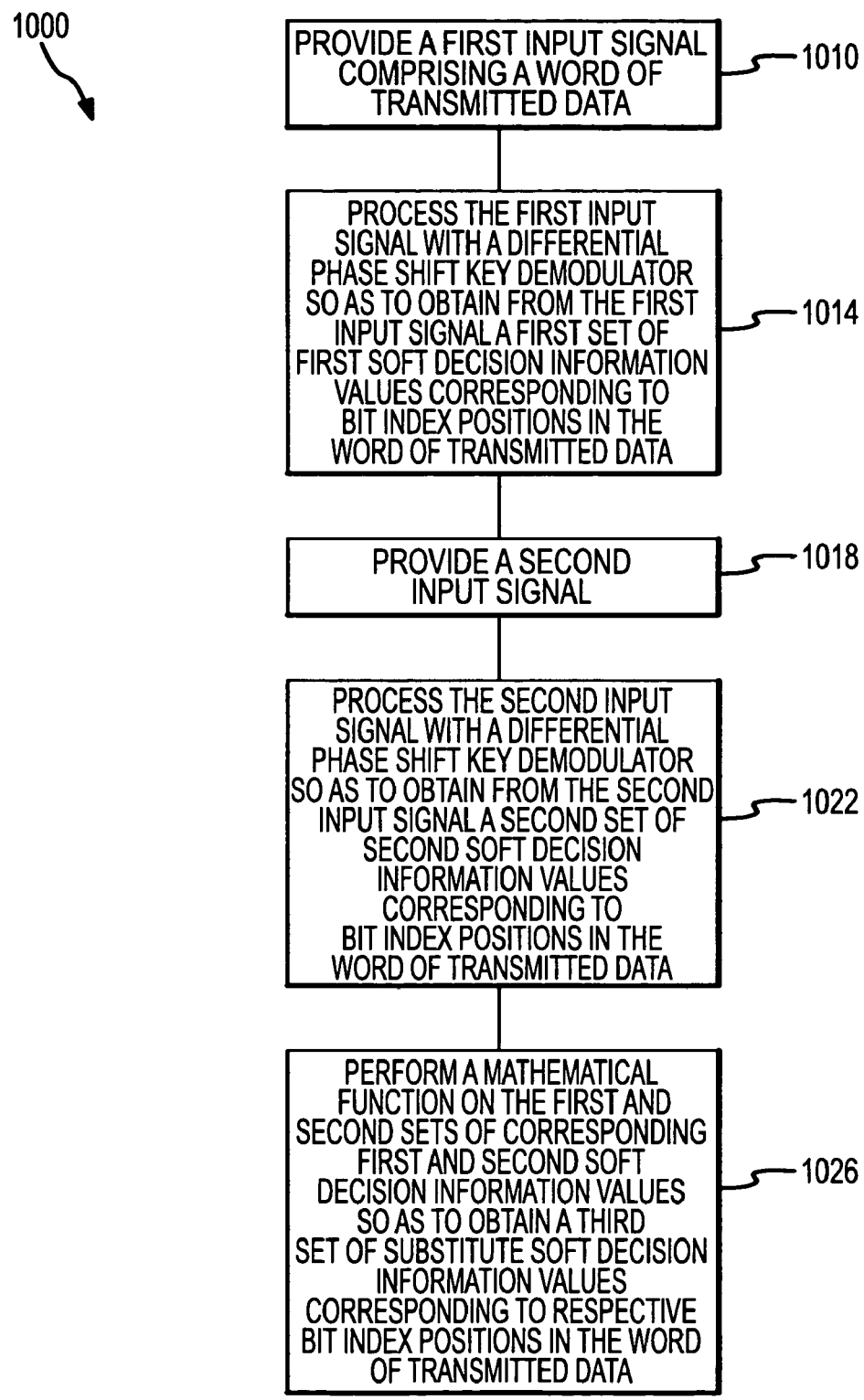
FIG. 10 illustrates a flowchart demonstrating a method of utilizing at least two sets of soft decision information to correct information in a demodulation system, according to one embodiment.

According to another embodiment, one can use multiple receptions of a data word to reduce errors. As noted in the embodiment of FIG. 5, SPS ephemeris data can be repeated in every frame of data. Thus, assuming that this ephemeris data does not change between successive frames, the SPS receiver can receive the same ephemeris data approximately every 30 seconds. Consequently, this provides additional soft decision information that can be used by the receiver. FIG. 10 illustrates an example according to one embodiment.

FIG. 10 illustrates a flowchart 1000 that describes a method in which two transmissions of a data word can be utilized, for example. Block 1010 indicates that a first input signal comprising a word of transmitted data is provided. For example, a receiver can receive a 30 bit word of transmitted frame data in a SPS system. Block 1014 shows that the first input signal is processed with a demodulator, such as a DPSK demodulator, so as to obtain a first set of soft decision information values. For example, soft decision information values can be stored for each bit index position in the received word of data.

Block 1018 indicates that a second input signal is provided. For example, one can receive a re-transmission of the same word of data by receiving a second frame of data in a SPS transmission that contains ephemeris data (i.e., the ephemeris data is repeated every frame) In block 1022, the second input signal is processed with a demodulator, such as the DPSK demodulator, to obtain from the second input signal a second set of second soft decision information values—i.e., soft decision information values are obtained for the second input signal that correspond to respective bit index positions in the transmitted word of data.

In block 1026, a mathematical function can be performed on the two sets of soft decision information values. This produces a third set of substitute soft decision information values that correspond to bit index positions in the transmitted word of data. The mathematical functions that can be performed are numerous. One example is that an averaging of the soft decision information values can be performed so as to produce an average value of soft decision information values that apply to respective bit index positions in the transmitted word of data. For example, a soft decision information value that corresponds with the first transmitted bit in the first input signal can be averaged with the soft decision information value that corresponds with the first transmitted bit in the second input signal. This produces an average value of soft decision information that corresponds to the first bit in the word of data. As another example, corresponding soft decision information values can be added or multiplied together or compute a weighted average, for example. Regardless, the presence of at least two data points (this process could be repeated to gather additional data points) allows a more accurate value of soft decision information to be determined.

Figure 11:
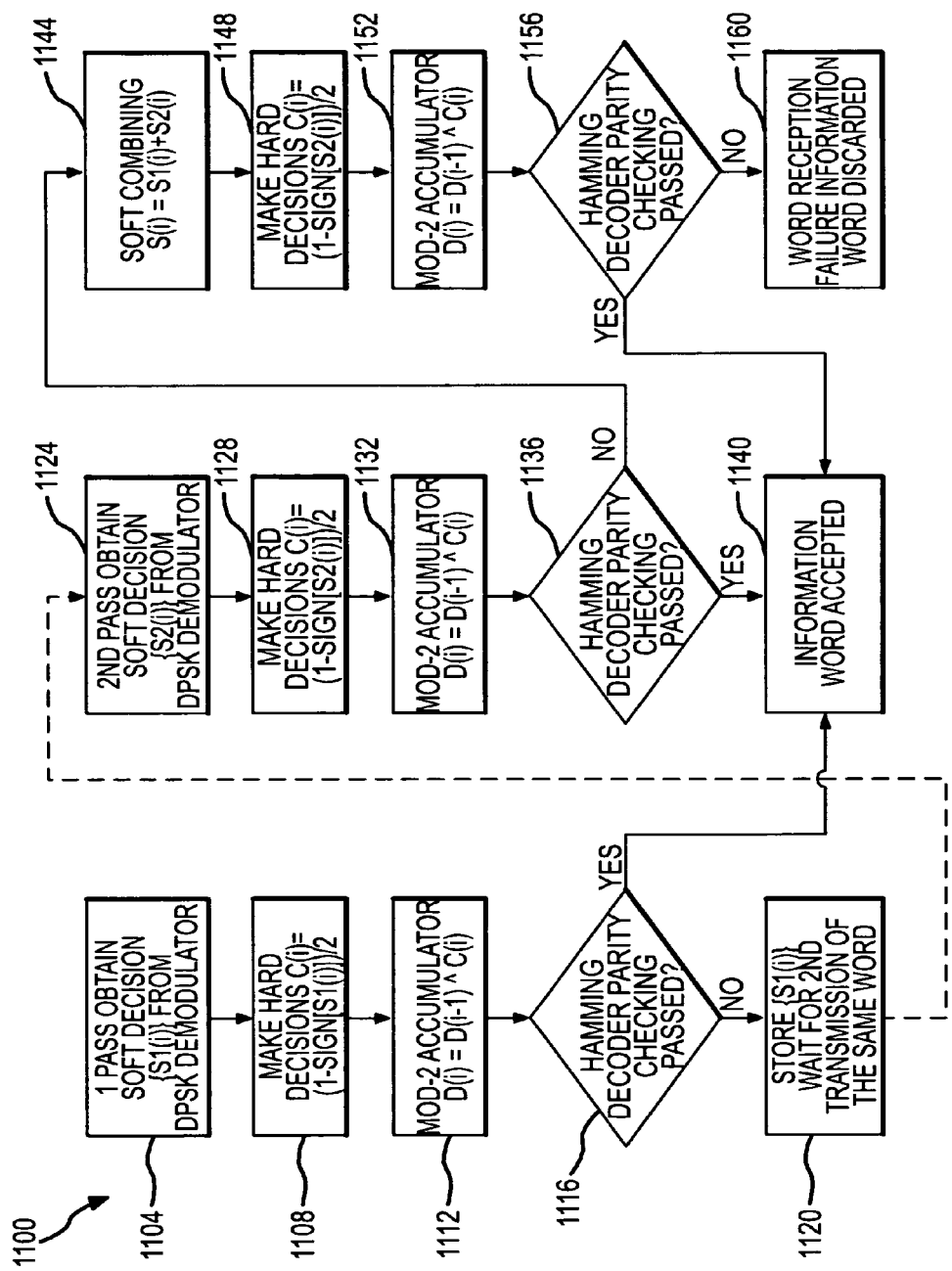
FIG. 11 illustrates a flowchart demonstrating a method of soft combining data in accordance with one embodiment.

FIG. 11 illustrates a flowchart 1100 demonstrating a method according to one embodiment. In block 1104, a first pass is performed in which a first set of soft decision information $\{S1(i)\}$ is obtained. Block 1108 shows that hard decisions can then be made using the soft decision information as inputs—namely, $C(i)=(1-\text{sign}[S1(i)])/2$. The hard decision information can then be input into a modulo-2 accumulator along with the preceding output of the modulo-2 accumulator to generate the output of the demodulator (e.g., according to the equation $D(i)=D(i-1)\hat{}C(i)$). This is shown by block 1112. In decision block 1116, a parity check is performed. For example, if Hamming code is used to encode the transmission, a Hamming code parity check can be performed.

If the decision block 1116 detects a parity error, the soft decision information can be stored and the receiver can wait for a second transmission of the same word, as shown by block 1120. Thus, block 1124 shows a second pass in which a second input signal is received and in which soft decision information $\{S2(i)\}$ is obtained at the demodulator. Block 1128 illustrates that hard decisions are made—$C(i)=(1-\text{sign}[S2(i)])/2$. Similarly, in block 1132 the hard decisions are input into a modulo-2 accumulator—$D(i)=D(i-1)\hat{}C(i)$. In block 1136, a parity check is performed. If the parity check passes, the information word from the second input signal is accepted, as shown by block 1140. If the parity check fails, a soft combining process can be performed.

Block 1144 illustrates an example of a soft combining process according to one embodiment. In this embodiment, the soft decision values are added together such that $S(i)=S1(i)+S2(i)$. However, as noted earlier, other mathematical functions could be employed to obtain the substitute values $S(i)$. Block 1148 illustrates that hard decisions can then be made—$C(i)=(1-\text{sign}[S(i)])/2$. Furthermore, using the hard decision output, the word that was initially encoded and transmitted can be reproduced as the output of the modulo-2 accumulator—$D(i)=D(i-1)\hat{}C(i)$, as shown in block 1152. Once again, a parity check can be performed, as shown in block 1156. If the parity passes, the information word is accepted. If the parity check fails, the word reception is a failure and the information word can be discarded.

Figure 4:
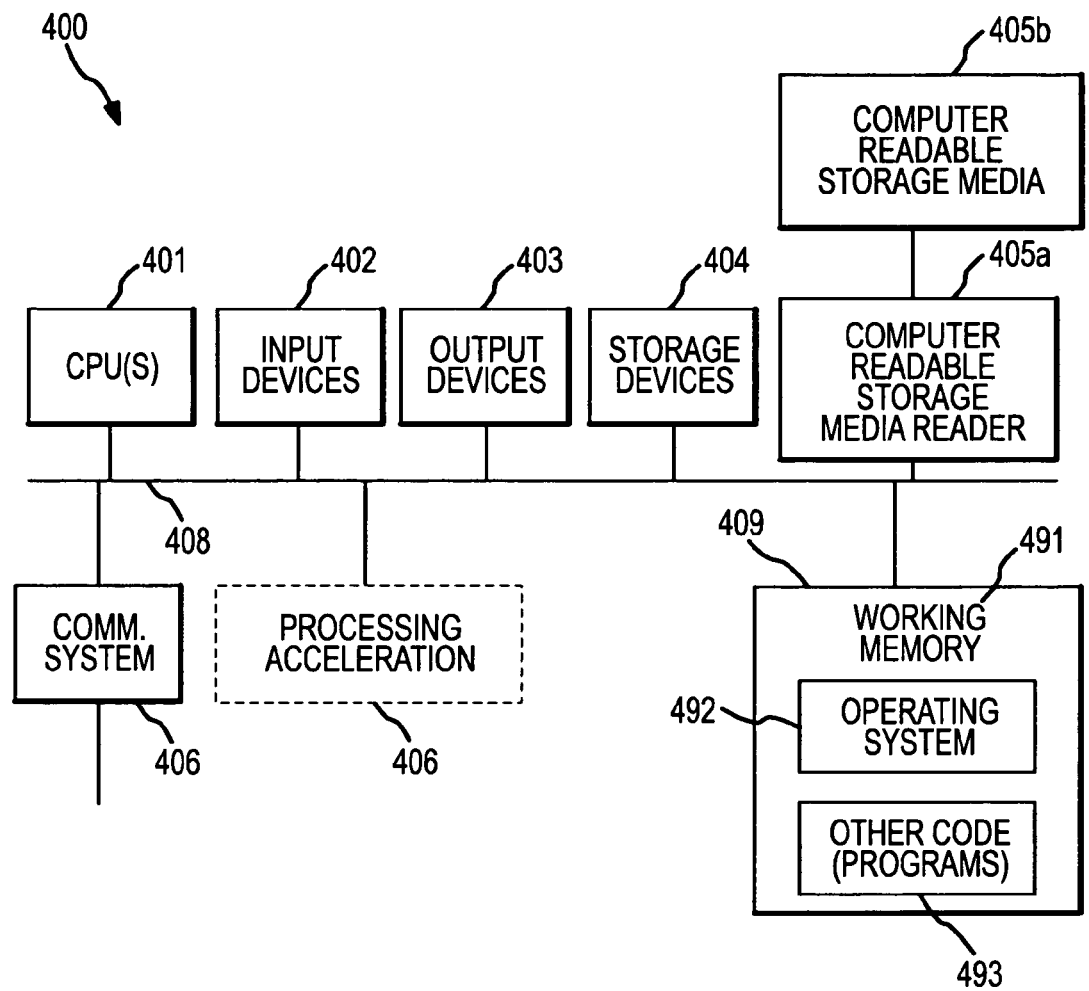
FIG. 4 illustrates a block diagram of a computing device, such as a communication device, for implementing the elements of FIG. 1 in accordance with one embodiment.

FIG. 4 broadly illustrates how individual system elements in FIG. 1 can be implemented. System 400 is shown comprised of hardware elements that are electrically coupled via bus 408, including a processor 401, input device 402, output device 403, storage device 404, computer-readable storage media reader 405a, communications system 406 processing acceleration (e.g., DSP or special-purpose processors) 407 and memory 409. Computer-readable storage media reader 405a is further coupled to computer-readable storage media 405b, the combination comprehensively representing remote, local, fixed and/or removable storage devices plus storage media, memory, etc. for temporarily and/or more permanently containing computer-readable information, which can include storage device 404, memory 409 and/or any other such accessible system 400 resource. System 400 can also comprise software elements (shown as being currently located within working memory 491) including an operating system 492 and other code 493, such as programs, applets, data and the like.

Figure 12:
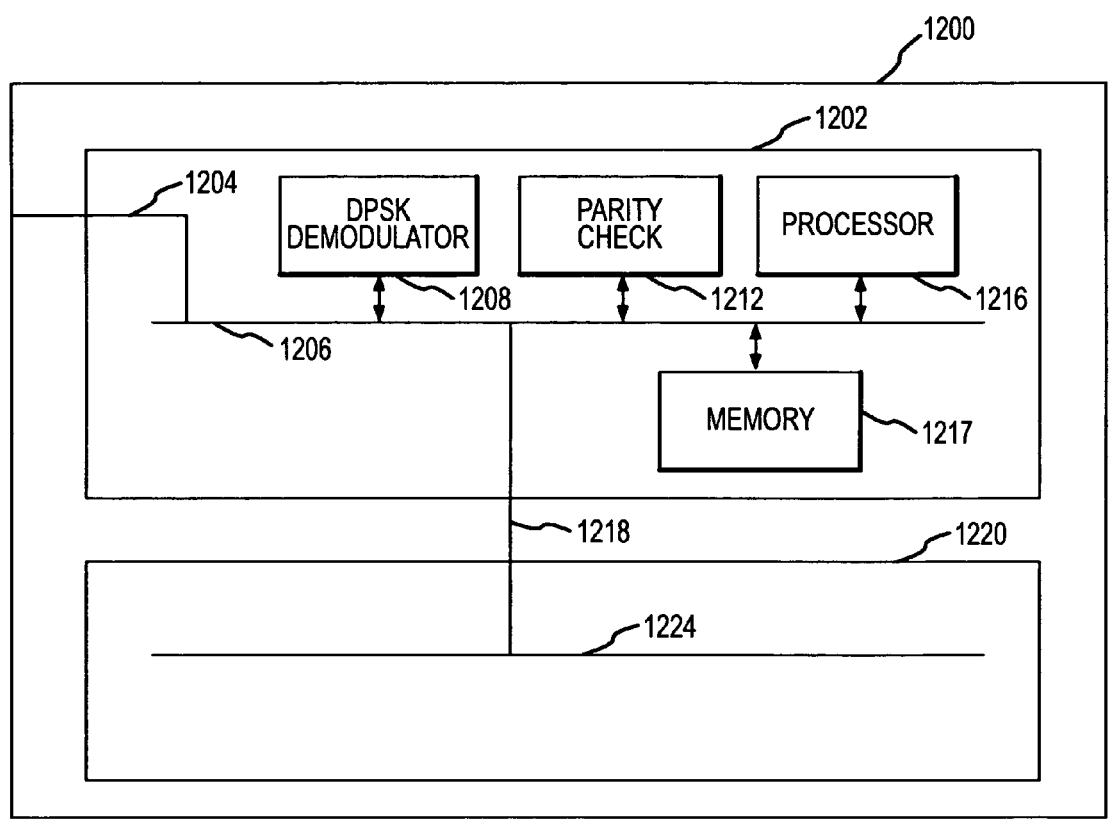
FIG. 12 illustrates an exemplary receiver according to one embodiment.

FIG. 12 illustrates another embodiment of a receiver. FIG. 12 shows a receiver 1200 having an integrated circuit 1202 and cell phone circuit 1220. A bus of the integrated circuit is coupled with a bus of the cell phone circuit via conductor 1218 or equivalent coupling. Bus 1206 is coupled with input circuit 1204. Furthermore, bus 1206 is further coupled with DPSK Demodulator circuit 1208, Parity Check circuit 1212, processor 1216 and memory 1217. Computer code operable to implement the methods described above can be stored, for example, in memory 1217.

It will be apparent to those skilled in the art that embodiments may well be utilized in accordance with more specific application requirements. For example, one or more system elements might be implemented as sub-elements within a system 400 component (e.g. within communications system 406). Customized hardware might also be utilized and/or particular elements might be implemented in hardware, software (including so-called "portable software," such as applets) or both. Further, while connection to other computing devices such as network input/output devices (not shown) may be employed, it is to be understood that wired, wireless, modem and/or other connection or connections to other computing devices might also be utilized. Not all system 400 components will necessarily be required in all cases.

While various embodiments have been described as methods or apparatuses, it should be understood that various embodiments can be implemented through code coupled to a computer, e.g., code resident on a computer or accessible by the computer. For example, software could be utilized to implement many of the methods discussed above. Thus, in addition to embodiments accomplished by hardware, it is also noted that these embodiments can be accomplished through the use of an article of manufacture comprised of a computer usable medium having a computer readable program code embodied therein, which causes the enablement of the functions disclosed in this description. Therefore, it is desired that embodiments also be considered protected by this patent in their program code means as well. Furthermore, the embodiments may be embodied as code stored in a computer-readable memory of virtually any kind including, without limitation, RAM, ROM, magnetic media, optical media, or magneto-optical media. Even more generally, the embodiments could be implemented in software, or in hardware, or any combination thereof including, but not limited to, software running on a general purpose processor, microcode, PLAs, or ASICs.

It is also envisioned that embodiments could be accomplished as computer signals embodied in a carrier wave, as well as signals (e.g., electrical and optical) propagated through a transmission medium. Thus, the various information discussed above could be formatted in a structure, such as a data structure, and transmitted as an electrical signal through a transmission medium or stored on a computer readable medium.

It is also noted that many of the structures, materials, and acts recited herein can be recited as means for performing a function or steps for performing a function. Therefore, it should be understood that such language is entitled to cover all such structures, materials, or acts disclosed within this specification and their equivalents.

It is thought that the apparatuses and methods and their attendant advantages will be understood from this specification. While the above is a complete description of specific embodiments, the above description should not be taken as limiting the scope as defined by the claims.

What is claimed is:

1. A method of demodulating data, said method comprising:
   providing a first input signal representative of a plurality of bits;
   performing differential phase shift key demodulation on said first input signal so as to obtain a first set of binary data and so as to obtain soft decision information from said input signal for each bit in a subset of said first set of binary data;
   determining a parity error for the first set of binary data after said performing differential phase shift key demodulation;
   determining a bit in said subset of said first set of binary data with the lowest absolute value of soft decision information;
   toggling the binary value of said bit with the lowest absolute value of soft decision information so as to form a second set of binary data;
   checking for a parity error for the second set of binary data.

2. The method as claimed in claim 1 wherein said first input signal is a signal received from a satellite vehicle transmission.

3. The method as claimed in claim 1 wherein said checking for a parity error for said second set of binary data comprises determining the existence of a parity error and further comprising:
   determining a bit in said subset of said first set of binary data with the second lowest absolute value of said soft decision information;
   toggling the binary value of said bit in said first set of binary data having the second lowest absolute value of soft decision information so as to form a third set of binary data;
   checking for a parity error for the third set of binary data.

4. The method as claimed in claim 1 wherein said providing a first input signal comprises:
   providing a satellite positioning system receiver;
   receiving a signal from a satellite positioning satellite vehicle;
   coupling said signal with a differential phase shift key demodulator.

5. The method as claimed in claim 4 wherein said satellite positioning system receiver further comprises a mobile station.

6. The method as claimed in claim 5 wherein said satellite positioning system receiver provides satellite positioning system location information for use by said mobile station.

7. The method as claimed in claim 1 wherein said subset of said first set of binary data is said first set of binary data.

8. The method as claimed in claim 1 wherein said toggling said binary value of said bit further comprises toggling values of a plurality of bits so as to form said second set of binary data.

9. A method of demodulating data, said method comprising:
   providing a first input signal representative of a plurality of bits;
   performing differential phase shift key demodulation on said first input signal so as to obtain a first set of binary data and so as to obtain soft decision information from said input signal for each bit in a subset of said first set of binary data;
   determining a parity error for the first set of binary data after said performing differential phase shift key demodulation;
   determining a first bit in said subset of said first set of binary data with the lowest absolute value of soft decision information;
   determining a second bit in said subset of said first set of binary data with the next lowest absolute value of soft decision information;
   testing said value of said soft decision information for said first bit against said value of said soft decision information for said second bit so as to determine whether said value of said soft decision information for said first bit is sufficiently different from said value of said soft decision information for said second bit, according to a predetermined standard;
   toggling the binary value of said bit with the lowest absolute value of soft decision information so as to form a second set of binary data if said value of said soft decision information for said first bit satisfies said predetermined standard.

10. The method as claimed in claim 9 wherein said toggling said binary value of said bit with the lowest absolute value of soft decision information further comprises toggling a plurality of bits satisfying said predetermined standard.

11. The method as claimed in claim 9 and further comprising:
   providing a second input signal representative of said plurality of bits if said value of said soft decision information for said first bit does not satisfy said predetermined standard.

12. The method as claimed in claim 9 and further comprising:
   checking for a parity error for the second set of binary data.

13. The method as claimed in claim 9 wherein said predetermined standard comprises:
   determining whether:

LowBit<alpha*NextLowBit wherein LowBit represents the magnitude of the soft decision information for said first bit and wherein alpha represents a predetermined multiplier and wherein NextLowBit represents the magnitude of the soft decision information for said second bit.

14. The method as claimed in claim 9 wherein said predetermined standard comprises:
   determining whether:

LowBit<alpha*NextLowBit+Beta*($N0/2$)

wherein LowBit represents the magnitude of the soft decision information for said first bit and wherein alpha represents a predetermined multiplier and wherein NextLowBit represents the magnitude of the soft decision information for said second bit and wherein Beta is a second predetermined multiplier and wherein ($N0/2$) is the variance of noise at the input to a differential phase shift key demodulator utilized to perform said differential phase shift key demodulation.

15. The method as claimed in claim 9 wherein said first input signal is an attenuated signal received from a satellite vehicle transmission.

16. The method as claimed in claim 9 wherein said providing a first input signal comprises:
   providing a satellite positioning system receiver;
   receiving a signal from a satellite positioning satellite vehicle;
   coupling said signal with a differential phase shift key demodulator.

17. The method as claimed in claim 16 wherein said satellite positioning system receiver further comprises a mobile station.

18. The method as claimed in claim 17 wherein said satellite positioning system receiver provides satellite positioning system location information for use by said mobile station.

19. The method as claimed in claim 9 wherein said subset of said first set of binary data is said first set of binary data.

20. A method of demodulating data, said method comprising:
   providing a first input signal comprising a word of transmitted data;
   processing said first input signal with a differential phase shift key demodulator so as to obtain from said first input signal a first set of first soft decision information values corresponding to bit index positions in said word of transmitted data;
   providing a second input signal;
   processing said second input signal with a differential phase shift key demodulator so as to obtain from said second input signal a second set of second soft decision information values corresponding to bit index positions in said word of transmitted data;
   performing a mathematical function on said first and second sets of corresponding first and second soft decision information values so as to obtain a third set of substitute soft decision information values corresponding to respective bit index positions in said word of transmitted data.

21. The method as claimed in claim 20 and further comprising:
   toggling a hard decision bit value based upon said substitute soft decision information values.

22. The method as claimed in claim 21 wherein said toggling said bit value comprises:
   toggling the binary value of a hard decision bit associated with the lowest absolute value magnitude of substitute soft decision information.

23. The method as claimed in claim 20 wherein said performing said mathematical function comprises:
   averaging the magnitude of said first soft decision information value and the magnitude of said second soft decision information value corresponding to a particular bit index position in said word of data.

24. The method as claimed in claim 23 wherein said averaging comprises performing a weighted average.

25. The method as claimed in claim 21 wherein said performing said mathematical function comprises adding the magnitude of said first soft decision information value and the magnitude of said second soft decision information value corresponding to a particular bit index position in said word of data.

26. The method as claimed in claim 21 wherein said performing said mathematical function comprises multiplying the magnitude of said first soft decision information value with the magnitude of said second soft decision information value corresponding to a particular bit index position in said word of data.

27. The method as claimed in claim 21 wherein said providing said first input signal comprises:
   receiving a first satellite transmission corresponding to said first word of data; and
   wherein said providing said second input signal comprises:
   receiving a second satellite transmission corresponding to said first word of data.

28. A receiver configured for demodulating data, said receiver comprising:
   an input for receiving a first input signal representative of a plurality of bits;
   a differential phase shift key demodulator for performing differential phase shift key demodulation on said first input signal so as to obtain a first set of binary data and so as to obtain soft decision information from said input signal for each bit in a subset of said first. set of binary data;
   a parity error circuit for checking parity error for the first set of binary data after said performing differential phase shift key demodulation;
   a processor configured for determining a bit in said subset of said first set of binary data with the lowest absolute value of soft decision information;

wherein said processor is further configured for toggling the binary value of said bit with the lowest absolute value of soft decision information so as to form a second set of binary data; and wherein said processor is further configured for checking for a parity error for the second set of binary data.

29. The receiver as claimed in claim 28 wherein said first input signal is an attenuated signal received from a satellite vehicle transmission and wherein said receiver is configured to receive said attenuated signal.

30. The receiver as claimed in claim 28 wherein said processor is further configured for:
determining the existence of a parity error;
determining a bit in said subset of said first set of binary data with the second lowest absolute value of said soft decision information; and
toggling the binary value of said bit in said first set of binary data having the second lowest absolute value of soft decision information so as to form a third set of binary data;
checking for a parity error for the third set of binary data.

31. The receiver as claimed in claim 28 wherein said first input signal comprises a satellite positioning signal transmitted from a satellite positioning system satellite vehicle and wherein said receiver comprises a circuit for coupling said satellite positioning system signal with said differential phase shift key demodulator.

32. The receiver as claimed in claim 31 wherein said satellite positioning system receiver is coupled with a mobile station.

33. The receiver as claimed in claim 32 wherein said satellite positioning system receiver is configured to communicate satellite positioning system location information for use by said mobile station.

34. The receiver as claimed in claim 28 wherein said processor is further configured for toggling the binary value of a plurality of bits so as to form said second set of binary data.

35. A receiver for demodulating data, said receiver comprising:
an input for receiving a first input signal representative of a plurality of bits;
a differential phase shift key demodulator for performing differential phase shift key demodulation on said first input signal so as to obtain a first set of binary data and so as to obtain soft decision information from said input signal for each bit in a subset of said first set of binary data;
a parity error detector for determining a parity error for the first set of binary data after said performing differential phase shift key demodulation;
a processor configured for determining a first bit in said subset of said first set of binary data with the lowest absolute value of soft decision information;
wherein said processor is further configured for determining a second bit in said subset of said first set of binary data with the next lowest absolute value of soft decision information; and
wherein said processor is further configured for testing said value of said soft decision information for said first bit against said value of said soft decision information for said second bit so as to determine whether said value of said soft decision information for said first bit is sufficiently different from said value of said soft decision information for said second bit, according to a predetermined standard; and
wherein said processor is further configured for toggling the binary value of said bit with the lowest absolute value of soft decision information so as to form a second set of binary data if said value of said soft decision information for said first bit satisfies said predetermined standard.

36. The receiver as claimed in claim 35 wherein said processor is further configured for toggling a plurality of bits that satisfy said predetermined standard so as to form said second set of binary data.

37. The receiver as claimed in claim 35 wherein said input is further configured for receiving a second input signal representative of said plurality of bits if said value of said soft decision information for said first bit does not satisfy said predetermined standard.

38. The receiver as claimed in claim 35 wherein said parity error detector is further configured for checking for a parity error for the second set of binary data.

39. The receiver as claimed in claim 35 wherein said predetermined standard comprises:
determining whether:

LowBit<alpha*NextLowBit wherein LowBit represents the magnitude of the soft decision information for said first bit and wherein alpha represents a predetermined multiplier and wherein NextLowBit represents the magnitude of the soft decision information for said second bit.

40. The receiver as claimed in claim 35 wherein said predetermined standard comprises:
determining whether:

LowBit<alpha*NextLowBit+Beta*(N0/2)

wherein LowBit represents the magnitude of the soft decision information for said first bit and wherein alpha represents a predetermined multiplier and wherein NextLowBit represents the magnitude of the soft decision information for said second bit and wherein Beta is a second predetermined multiplier and wherein (N0/2) is the variance of noise at the input to a differential phase shift key demodulator utilized to perform said differential phase shift key demodulation.

41. The receiver as claimed in claim 35 wherein said first input signal is an attenuated signal received from a satellite vehicle transmission and wherein said input is configured to receive said attenuated signal.

42. The receiver as claimed in claim 35 wherein said first input signal comprises a satellite positioning system signal transmitted from a satellite positioning satellite vehicle and wherein said receiver comprises:
a circuit for coupling said signal with a differential phase shift key demodulator.

43. The receiver as claimed in claim 42 wherein said receiver is coupled with a mobile station.

44. The receiver as claimed in claim 43 wherein said satellite positioning system receiver comprises a circuit for communicating satellite positioning system location information to said mobile station.

45. A receiver for demodulating data, said receiver comprising:
an input for receiving a first input signal comprising a word of transmitted data;
a differential phase shift key demodulator for performing differential phase shift key demodulation on said first input signal so as to obtain from said first input signal a first set of first soft decision information values corresponding to bit index positions in said word of transmitted data;
wherein said input is further configured for receiving a second input signal; and wherein said differential phase shift key demodulator is further configured for performing differential phase shift key demodulation on said second input signal so as to obtain from said second input signal a second set of second soft decision information values corresponding to bit index positions in said word of transmitted data;

a processor configured for performing a mathematical function on said first and second sets of corresponding first and second sort decision information values so as to obtain a third set of substitute soft decision information values corresponding to respective bit index positions in said word of transmitted data.

46. The receiver as claimed in claim 45 wherein said processor is further configured for toggling a hard decision bit value based upon said substitute soft decision information values.

47. The receiver as claimed in claim 46 wherein said receiver is further configured for toggling the binary value of a hard decision bit associated with the lowest absolute value magnitude of substitute soft decision information.

48. The receiver as claimed in claim 45 wherein said processor is further configured for averaging the magnitude of said first soft decision information value and the magnitude of said second soft decision information value corresponding to a particular bit index position in said word of data.

49. The receiver as claimed in claim 48 wherein said processor is further configured for computing a weighted average.

50. The receiver as claimed in claim 46 wherein said processor is further configured for adding the magnitude of said first soft decision information value and the magnitude of said second soft decision information value corresponding to a particular bit index position in said word of data.

51. The receiver as claimed in claim 46 wherein said receiver is configured for multiplying the magnitude of said first soft decision information value with the magnitude of said second soft decision information value corresponding to a particular bit index position in said word of data.

52. The receiver as claimed in claim 46 wherein said input is configured for receiving a first satellite transmission corresponding to said first word of data; and
receiving a second satellite transmission corresponding to said first word of data.

53. An integrated circuit configured for demodulating data, said integrated circuit comprising:
an input for receiving a first input signal representative of a plurality of bits;
a differential phase shift key demodulator for performing differential phase shift key demodulation on said first input signal so as to obtain a first set of binary data and so as to obtain soft decision information from said input signal for each bit in a subset of said first set of binary data;
a parity error circuit for checking parity error for the first set of binary data after said performing differential phase shift key demodulation;
a processor configured for determining a bit in said subset of said first set of binary data with the lowest absolute value of soft decision information;
wherein said processor is further configured for toggling the binary value of said bit with the lowest absolute value of soft decision information so as to form a second set of binary data; and
wherein said processor is further configured for checking for a parity error for the second set of binary data.

54. An integrated circuit for demodulating data, said integrated circuit comprising:
an input for receiving a first input signal representative of a plurality of bits;
a differential phase shift key demodulator for performing differential phase shift key demodulation on said first input signal so as to obtain a first set of binary data and so as to obtain soft decision information from said input signal for each bit in a subset of said first set of binary data;
a parity error detector for determining a parity error for the first set of binary data after said performing differential phase shift key demodulation;
a processor configured for determining a first bit in said subset of said first set of binary data with the lowest absolute value of soft decision information;
wherein said processor is further configured for determining a second bit in said subset of said first set of binary data with the next lowest absolute value of soft decision information; and
wherein said processor is further configured for testing said value of said soft decision information for said first bit against said value of said soft decision information for said second bit so as to determine whether said value of said soft decision information for said first bit is sufficiently different from said value of said soft decision information for said second bit, according to a predetermined standard; and
wherein said processor is further configured for toggling the binary value of said bit with the lowest absolute value of soft decision information so as to form a second set of binary data if said value of said soft decision information for said first bit satisfies said predetermined standard.

55. An integrated circuit for demodulating data, said integrated circuit comprising:
an input for receiving a first input signal comprising a word of transmitted data;
a differential phase shift key demodulator for performing differential phase shift key demodulation on said first input signal so as to obtain from said first input signal a first set of first soft decision information values corresponding to bit index positions in said word of transmitted data;
wherein said input is further configured for receiving a second input signal; and
wherein said differential phase shift key demodulator is further configured for performing differential phase shift key demodulation on said second input signal so as to obtain from said second input signal a second set of second soft decision information values corresponding to bit index positions in said word of transmitted data;
a processor configured for performing a mathematical function on said first and second sets of corresponding first and second soft decision information values so as to obtain a third set of substitute soft decision information values corresponding to respective bit index positions in said word of transmitted data.

56. An article of manufacture comprising:
a computer readable storage medium having computer readable program code means stored therein for causing demodulation, the computer readable program code means in said article of manufacture comprising:
computer readable program code means for causing a computer to effect providing a first input signal representative of a plurality of bits;
computer readable program code means for causing a computer to effect performing differential phase shift key demodulation on said first input signal so as to obtain a first set of binary data and so as to obtain soft decision information from said input signal for each bit in a subset of said first set of binary data;

computer readable program code means for causing a computer to effect determining a parity error for the first set of binary data after said performing differential phase shift key demodulation;

computer readable program code means for causing a computer to effect determining a bit in said subset of said first set of binary data with the lowest absolute value of soft decision information;

computer readable program code means for causing a computer to effect toggling the binary value of said bit with the lowest absolute value of soft decision information so as to form a second set of binary data;

computer readable program code means for causing a computer to effect checking for a parity error for the second set of binary data.

57. An article of manufacture comprising:

a computer readable storage medium having computer readable program code means stored therein for causing demodulation, the computer readable program code means in said article of manufacture comprising:

computer readable program code means for causing a computer to effect providing a first input signal representative of a plurality of bits;

computer readable program code means for causing a computer to effect performing differential phase shift key demodulation on said first input signal so as to obtain a first set of binary data and so as to obtain soft decision information from said input signal for each bit in a subset of said first set of binary data;

computer readable program code means for causing a computer to effect determining a parity error for the first set of binary data after said performing differential phase shift key demodulation;

computer readable program code means for causing a computer to effect determining a first bit in said subset of said first set of binary data with the lowest absolute value of soft decision information;

computer readable program code means for causing a computer to effect determining a second bit in said subset of said first set of binary data with the next lowest absolute value of soft decision information;

computer readable program code means for causing a computer to effect testing said value of said soft decision information for said first bit against said value of said soft decision information for said second bit so as to determine whether said value of said soft decision information for said first bit is sufficiently different from said value of said soft decision information for said second bit, according to a predetermined standard;

computer readable program code means for causing a computer to effect toggling the binary value of said bit with the lowest absolute value of soft decision information so as to form a second set of binary data if said value of said soft decision information for said first bit satisfies said predetermined standard.

58. An article of manufacture comprising:

a computer readable storage medium having computer readable program code means stored therein for causing demodulation, the computer readable program code means in said article of manufacture comprising:

computer readable program code means for causing a computer to effect providing a first input signal comprising a word of transmitted data;

computer readable program code means for causing a computer to effect processing said first input signal with a differential phase shift key demodulator so as to obtain from said first input signal a first set of first soft decision information values corresponding to bit index positions in said word of transmitted data;

computer readable program code means for causing a computer to effect providing a second input signal;

computer readable program code means for causing a computer to effect processing said second input signal with a differential phase shift key demodulator so as to obtain from said second input signal a second set of second soft decision information values corresponding to bit index positions in said word of transmitted data;

computer readable program code means for causing a computer to effect performing a mathematical function on said first and second sets of corresponding first and second soft decision information values so as to obtain a third set of substitute soft decision information values corresponding to respective bit index positions in said word of transmitted data.

* * * * *